United States Patent
Deng et al.

(10) Patent No.: US 8,379,467 B2
(45) Date of Patent: Feb. 19, 2013

(54) STRUCTURE AND METHODS FOR MEASURING MARGINS IN AN SRAM BIT

(75) Inventors: Xiaowei Deng, Plano, TX (US); Theodore W. Houston, Richardson, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/043,229

(22) Filed: Mar. 8, 2011

(65) Prior Publication Data

US 2011/0158018 A1  Jun. 30, 2011

Related U.S. Application Data

(62) Division of application No. 12/388,439, filed on Feb. 18, 2009, now Pat. No. 8,139,431.

(51) Int. Cl.
*G11C 7/00* (2006.01)

(52) U.S. Cl. ............... 365/201; 365/203; 365/230.06

(58) Field of Classification Search ............... 365/201, 365/194, 230.06, 189.09, 189.14, 189.15, 365/203, 203.08

See application file for complete search history.

(56) References Cited

U.S. PATENT DOCUMENTS

| 2006/0168491 | A1* | 7/2006 | Lee et al. ............... 714/733 |
| 2009/0175113 | A1* | 7/2009 | Deng et al. ............... 365/226 |
| 2010/0232242 | A1 | 9/2010 | Deng et al. |

OTHER PUBLICATIONS

Zheng Guo et al. "Large-Scale Read/Write Margin Measurement in 45 nm CMOS SRAM Arrays," 2008 IEEE Symposium on VLSI Circuits, pp. 42-43, Jun. 2008.

* cited by examiner

*Primary Examiner* — Richard Elms
*Assistant Examiner* — Hien Nguyen
(74) *Attorney, Agent, or Firm* — Rose Alyssa Keagy; Wade J. Brady, III; Frederick J. Telecky, Jr.

(57) ABSTRACT

Integrated circuit for performing test operation of static RAM bit and for measuring the read margin, write margin, and stability margin of SRAM bits with operational circuitry that includes effects of the SRAM array architecture and circuit design. In addition, the integrated circuit has a built-in self-test circuit for measuring the read margin, write margin, and stability margin of SRAM that excludes the effects of SRAM array architecture and circuit design.

5 Claims, 10 Drawing Sheets

STRUCTURE AND METHODS FOR MEASURING MARGINS IN AN SRAM BIT

CROSS-REFERENCE TO RELATED APPLICATIONS

This application is a division of application Ser. No. 12/388,439, filed Feb. 18, 2009, the content of which is hereby incorporated by reference.

FIELD OF THE INVENTION

This invention relates to the field of integrated circuits. More particularly, this invention relates to margin testing of static random access memories (SRAMs) in integrated circuits.

DETAILED DESCRIPTION

Figure 1:
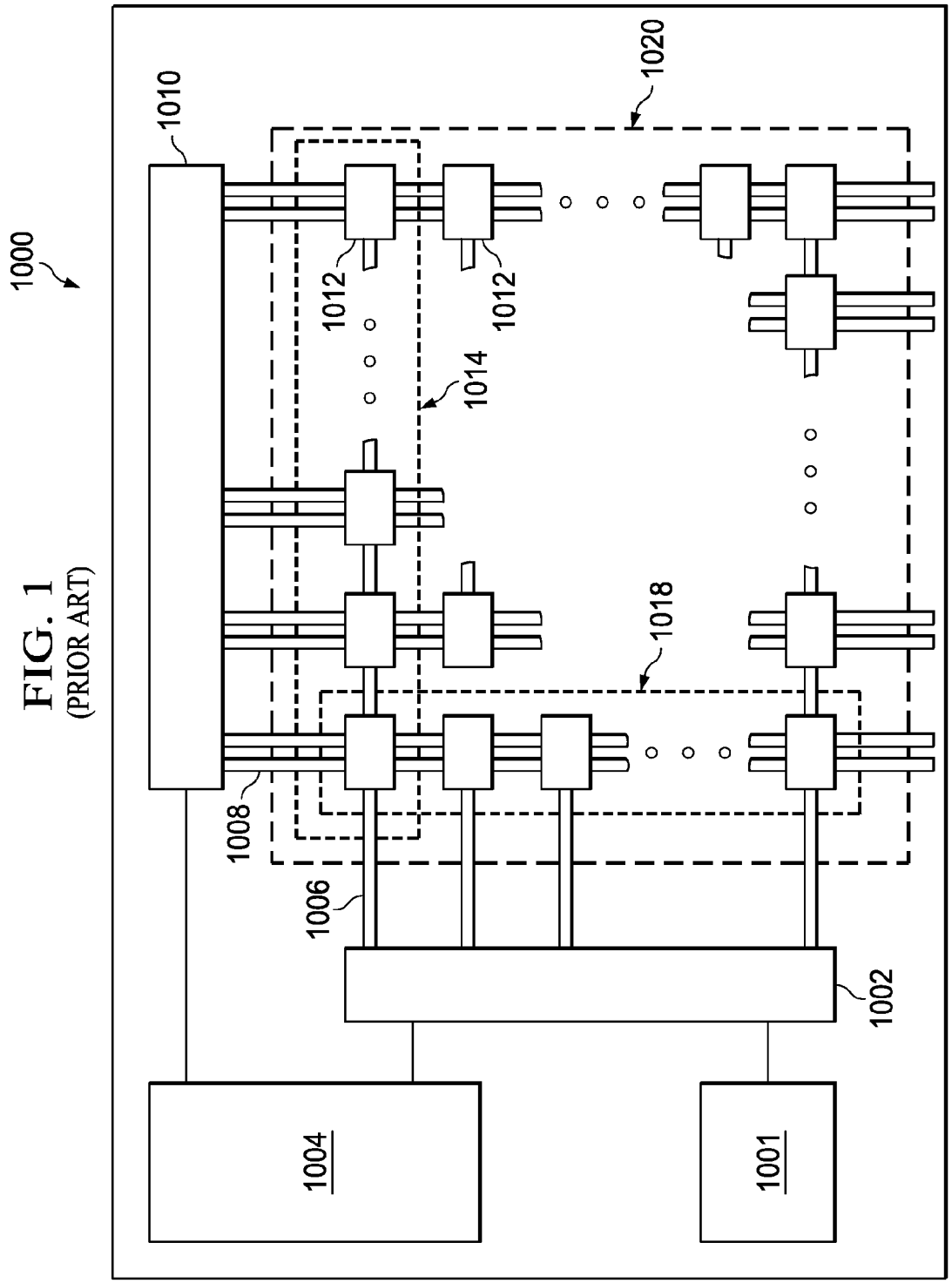
FIG. 1 is a prior art diagram illustrating an SRAM circuit.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A margin test typically finds the voltage range over which an SRAM circuit writes and reads a bit correctly. The usual practice is to raise the power supply voltage until the maximum voltage (Vmax) at which the SRAM circuit can successfully write and read a data value from the SRAM bits in the SRAM array is determined, and then to lower the power supply voltage until the minimum voltage (Vmin) at which the SRAM circuit can successfully operate is determined. In usual practice the wordline voltage, the bit voltage, and the bitline voltage are all the same value and are changed in unison to determine Vmax and Vmin. Since the same set of voltages is used during all portions (write, read, or read disturb) of the margin test, it is not known which margin the SRAM circuit failed. The instant invention teaches a method of changing the wordline voltage, bit voltage, and bitline voltage independently and also a method of changing these voltages during only a portion of the margin test (i.e. only during the write portion for write margin, only during the read portion for read margin, and only during read disturb for stability margin) which not only determines the margin of the SRAM circuit but also determines if it failed due to a write margin failure, a read margin failure, or a stability margin failure.

Figure 2:
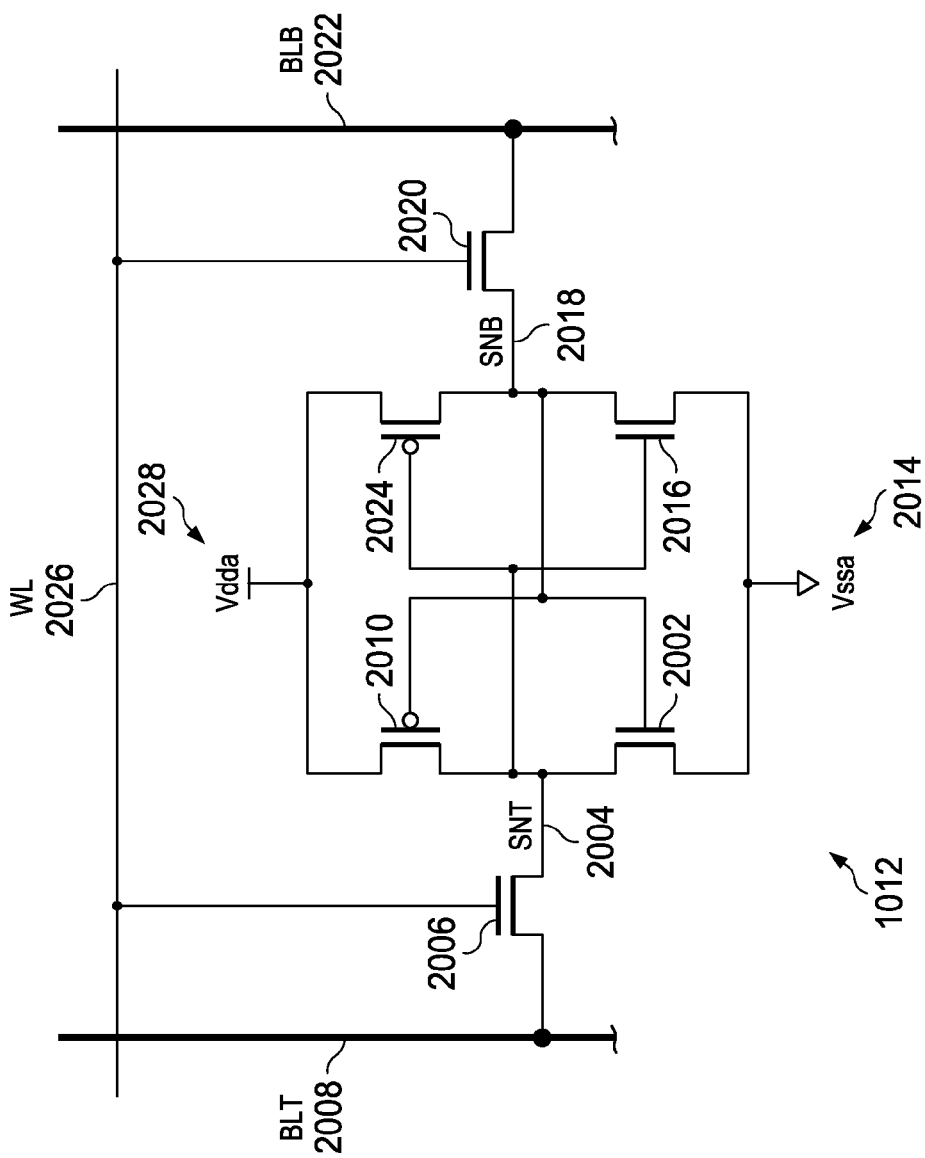
FIG. 2 is a prior art diagram illustrating an SRAM bit.

For the purposes of this disclosure, the term "Vdda" refers to the SRAM bit voltage (2028) in FIG. 2. This voltage is applied to the source nodes of p-channel (PMOS) transistors (2010) and (2024). Similarly, the term "Vssa" refers to the SRAM bit low voltage power supply which usually is close to ground (2014) in FIG. 2. This voltage is applied to source nodes of n-channel (NMOS) transistors (2002) and (2016). The term "floated" is understood to mean disconnected from a voltage source such as Vdda (2028) or Vssa (2014), or connected to a voltage source through a high impedance load, for example a transistor, a resistor or a diode.

In this disclosure, the term "pullup transistor" is understood to refer to a PMOS transistor in the SRAM bit (1012), for example (2010) and (2024) in FIG. 2.

The term "pulldown" transistor is understood to refer to one of the NMOS transistors in the SRAM bit (1012) for example (2002) and (2016) in FIG. 2.

The term "passgate" transistor is understood to refer to yet another NMOS transistor in SRAM bit (1012) for example (2006) and (2020) in FIG. 2.

For the purposes of this disclosure, the term "addressed SRAM bit" is understood to refer to an SRAM bit in which the passgate transistor (2006), and a second passgate transistor (2020) if present, are turned on, and a bit line true (2008), and a bitline-bar (2022) if present, are connected to read and write circuitry.

The term "characterization voltage" refers to a read characterization voltage and a write characterization voltage which is chosen as a reference set of voltages during the read and write operations of the SRAM bit. The characterization voltage consists of a wordline voltage, a bit voltage, and a bitline voltage. The write characterization voltage and the read characterization voltage could be the nominal operating voltages, could be the voltages at the upper or lower limit of the manufacturers specified operating range, or some other voltages. The write characterization voltages and the read characterization voltages may be the same or they may be different. During a write margin test, the read characterization voltages are chosen so the SRAM bit reads correctly. The SRAM bit may or may not function properly with the write characterization voltages during a write margin test. During a read margin test, the write characterization voltages are chosen so the SRAM bit writes correctly. Moreover, during a read margin test the SRAM bit may or may not function properly with the read characterization voltages. During a stability margin test, the write and read characterization voltages are chosen so the SRAM bit writes and reads correctly. The SRAM bit may or may not function properly with the read characterization voltages chosen for the data perturb read operation, during the data perturb read operation portion of the stability margin test, The term "transition voltages" refers to a write transition voltage, a bit transition voltage, or bitline voltage. It is the voltage that is at the boundary between the voltages at which the SRAM bit functions correctly and the voltages at which the SRAM bit fails to function correctly.

The term "margin" is typically defined as the difference between the characterization voltages and the transition voltages but it is understood some other mathematical function of the characterization voltage and the transition voltage may be used. Margin may refer to a write margin, a read margin, or a stability margin.

The term "nominal operating voltages" refer to the set of voltages at which the SRAM circuit would normally be biased when operating in a product.

The term "search voltage" refers to a read search voltage, a write search voltage, or a stability search voltage. The search voltage usually is different than the characterization voltage. A set of search voltages for a margin test, consists of a changed wordline voltage, a changed bit voltage, or changed bitline voltage or some combination of two or three of these changed voltages.

During the testing for read, write, or stability margin, search voltages are usually changed in some systematic way to find the transition voltage. The search voltage may be changed in equal steps of 10 mV until the transition voltage is located, or it may be changed first in larger voltage steps and later in smaller voltage steps to reduce testing time. It is understood the voltage step size and step sequence may be optimized in a number of ways to reduce testing time.

The term "test mode" refers to the mode of operating the SRAM circuit when the read, write, and stability margins are being characterized. This mode is different than the normal operating mode in which the SRAM array reads, writes, and stores bits during normal operation. In the testing mode the wordline voltage and array voltage may be individually controlled during the read, write, and store operations.

"Operational circuitry" refers the circuitry in an SRAM circuit that is used to read from or write data to the SRAM bit during the normal operation of the SRAM circuit. It can also be used during the test mode to read or write data. Typically operational circuitry includes wordline drivers, bit line drivers, sense amps, and other circuitry for reading and writing and refreshing the SRAM bits in the SRAM array. Additional "test circuitry" may be added to extend the delay time between wordline enable and sense amp enable, to extend the duration of the wordline pulse, to extend the bitline precharge time, or to drive the bitlines during the test mode. Unlike the "operational circuitry" which is used during normal operation of the SRAM circuit, "test circuitry" may be used only when the SRAM circuit has been switched into the test mode, for example. This additional test circuitry may be used during margin testing to measure the margin of an SRAM bit that is substantially independent of SRAM array architecture or circuit design.

In some instances of integrated circuits containing SRAM bit arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM bit arrays, such as microprocessors, digital signal processors and wireless telephony controllers, circuits which provide data to be stored in the SRAM array and circuits which use data from the SRAM array are located in the integrated circuit.

FIG. 1 is an illustration of an SRAM circuit (1000) containing a plurality of SRAM bits (1012) in an SRAM array (1020). The SRAM circuit includes SRAM bits (1012) in an SRAM array (1020) arranged in rows (1014) that are connected to bitline drivers (1002) by bitlines (1006) and arranged in columns (1018) that are connected to wordline drivers (1010) by wordlines (1008). The operational circuitry includes control circuitry (1004) which sends signals to the wordline drivers (1010) to apply the proper voltage to the wordlines (1008) and to the bitline drivers (1002) to apply the proper voltage to bitlines (1006) during the read and write operation of the selected SRAM bit (1012) during normal operation and also during the testing mode of the selected SRAM bit (1012). It also includes additional periphery circuitry (1001) such as sense amplifiers and bitline precharge circuits.

FIG. 2 is an illustration of a 6T SRAM bit (1012). The 6T SRAM bit is used for purposes of illustration but it is understood that this invention works equally well with other SRAM bits. The sources of the PMOS pullup transistors (2010) and (2024) are connected to the bit voltage, Vdda (2028). The drain of the left pullup transistor (2010) is connected to the left storage node (2004) that is labeled as storage node true (SNT). The drain of the right pullup transistor (2024) is connected to the right storage node (2018) that is labeled as storage node bar (SNB). The sources of NMOS pulldown transistors (2002) and (2016) are connected to the low voltage bit voltage, Vssa (2014), which is a voltage at or close to ground. The drain of the left pulldown transistor (2002) is connected to SNT (2004) and the drain of the right pulldown transistor (2016) is connected to SNB (2018). One side of left NMOS passgate transistor (2006) is connected to SNT (2004), and the other side is connected to the left bit line (2008) that is labeled as bit line true (BLT). One side of the right NMOS passgate transistor (2020) is connected to storage node, SNB (2018) and the other side is connected to the right bit line (2022) that is labeled as bit line bar (BLB). The gates of both passgate transistors, (2006) and (2020), are connected to the wordline (2026).

In a store operation of an SRAM bit, a low voltage data value is on one of the storage nodes (SNT for example) and a high voltage data value is on the other storage node (SNB for example). During the storage operation the voltage on the wordline (2026) is low so that the passgate transistors (2006) and (2020) are turned off. To read the SRAM bit (1012), BLT (2008) and BLB (2022) are precharged to a voltage near Vdda and then floated (disconnected from the power supply). A voltage pulse is then applied to the wordline (2026) to turn the passgates (2006) and (2020) on for a time equal to the wordline pulse width. After a time delay, the bitlines (2008) and (2022) are connected to a sense amp (not shown) which reads the data value in the SRAM bit (1012) by measuring the difference in voltage levels between the two bitlines (2008) and (2022).

To illustrate the write operation, an SRAM bit (1012) with SNT at a low voltage and with SNB at a high voltage is selected as a starting point. This may be defined as a logic state "0" for example. During the write operation BLT (2008) is precharged to a voltage near Vdda (2028) and BLB (2022) is precharged to a voltage near Vssa (2014). A voltage pulse is then applied to the wordline (2026) to turn on the passgate transistors (2006) and (2020). The low voltage on BLB (2022) pulls the voltage on SNB (2018), from high to low until the trip point of the left inverter, formed by NMOS pulldown transistor (2002) and PMOS pullup transistor (2010), is reached. The PMOS pullup transistor (2010) turns on, pulling storage node, SNT, up to a high voltage This changes the gate voltage of the right hand inverter formed by PMOS transistor (2024) and NMOS transistor (2016); turning the PMOS transistor (2024) off and the NMOS transistor (2016) on. The voltage on SNT (2004) is now high and the voltage on SNB (2018) is low. As a result, the opposite logic state has now been written into the SRAM bit (1012).

Figure 3A:
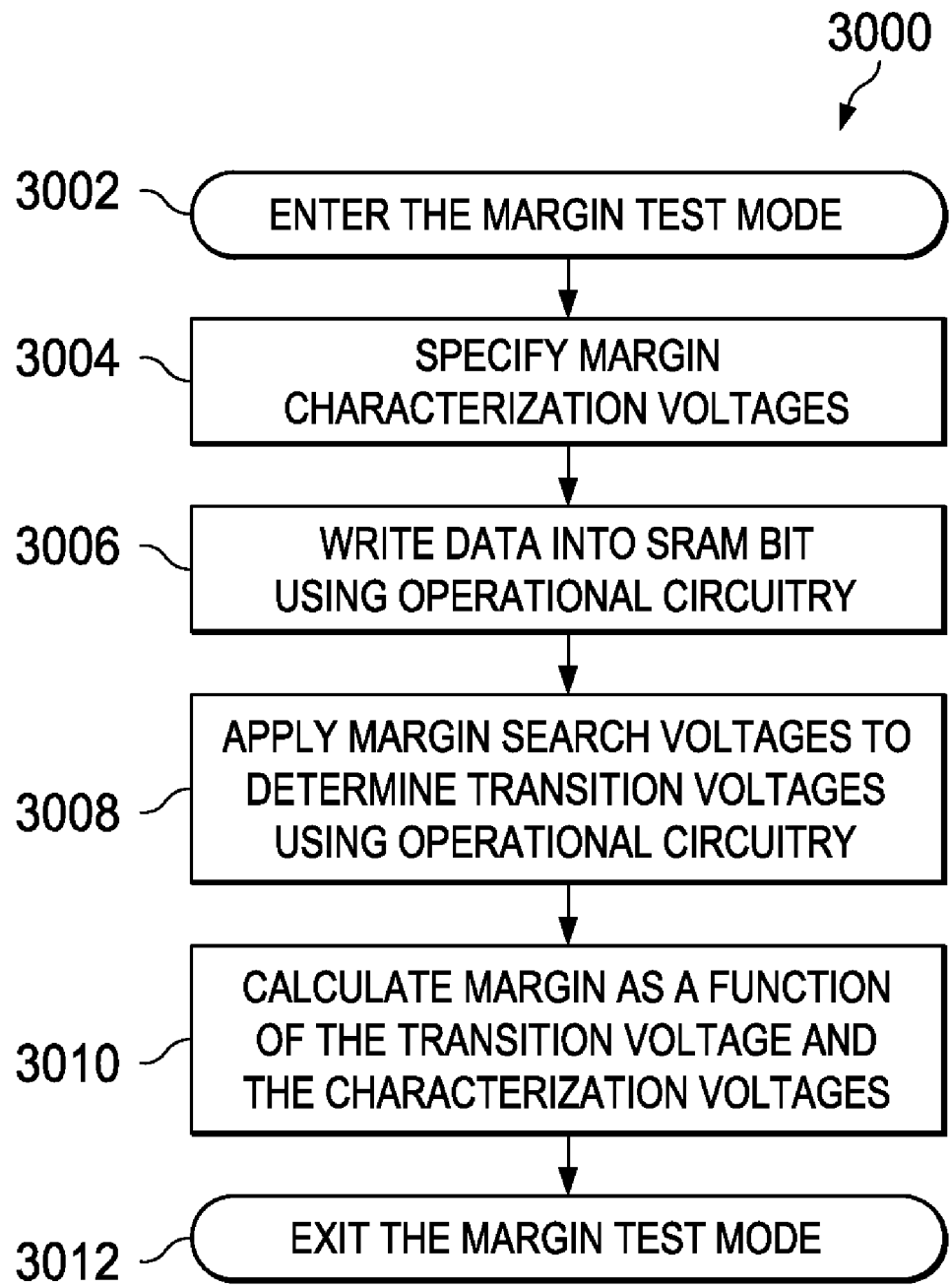
FIG. 3A is a flow chart of a margin test.
Figure 3B:
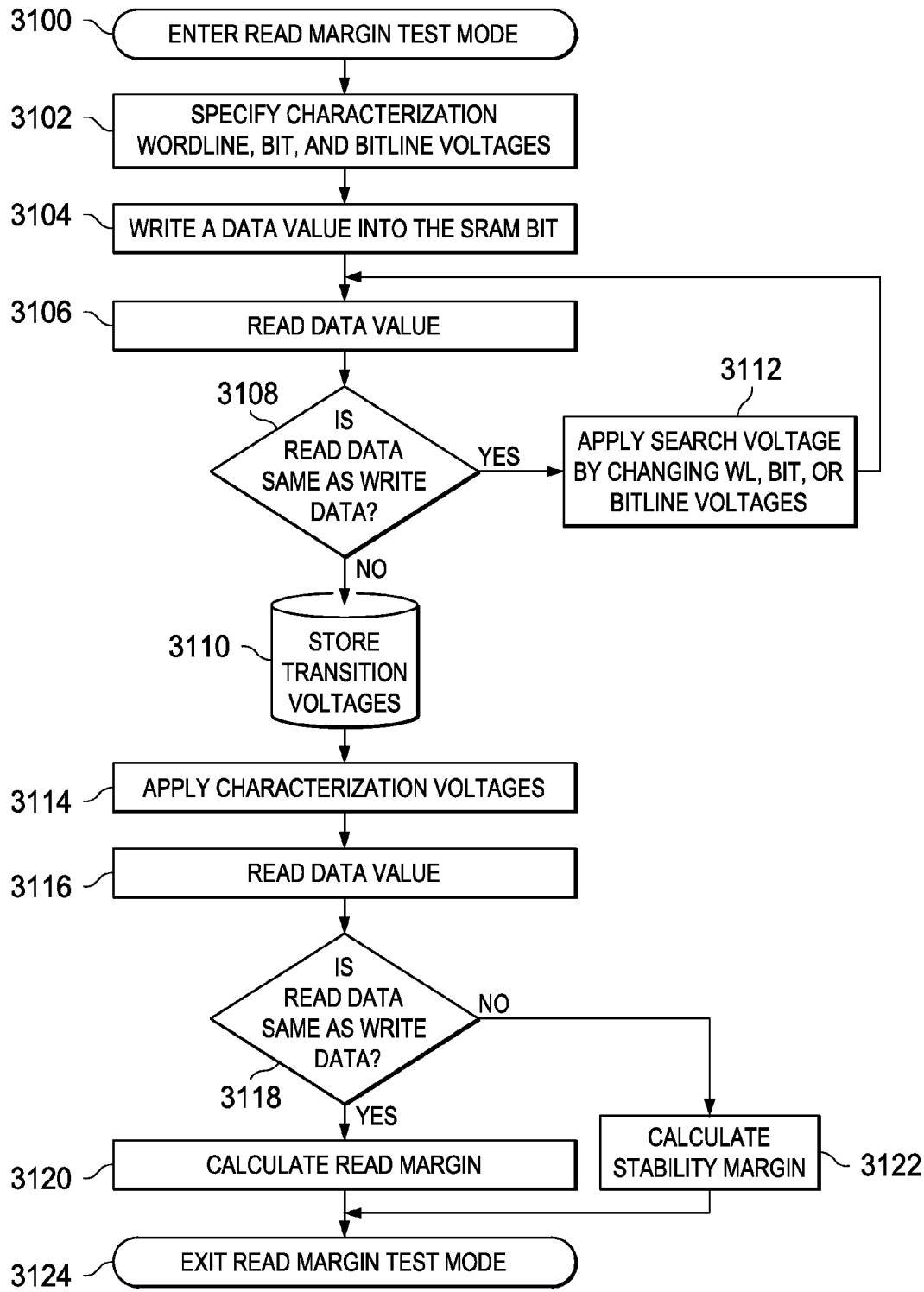
FIGS. 3B through 3D are flow charts of the Read Margin Test, the Write Margin Test, and the Stability Margin Test respectively where each margin test includes layout and circuit design effects.
Figure 3C:
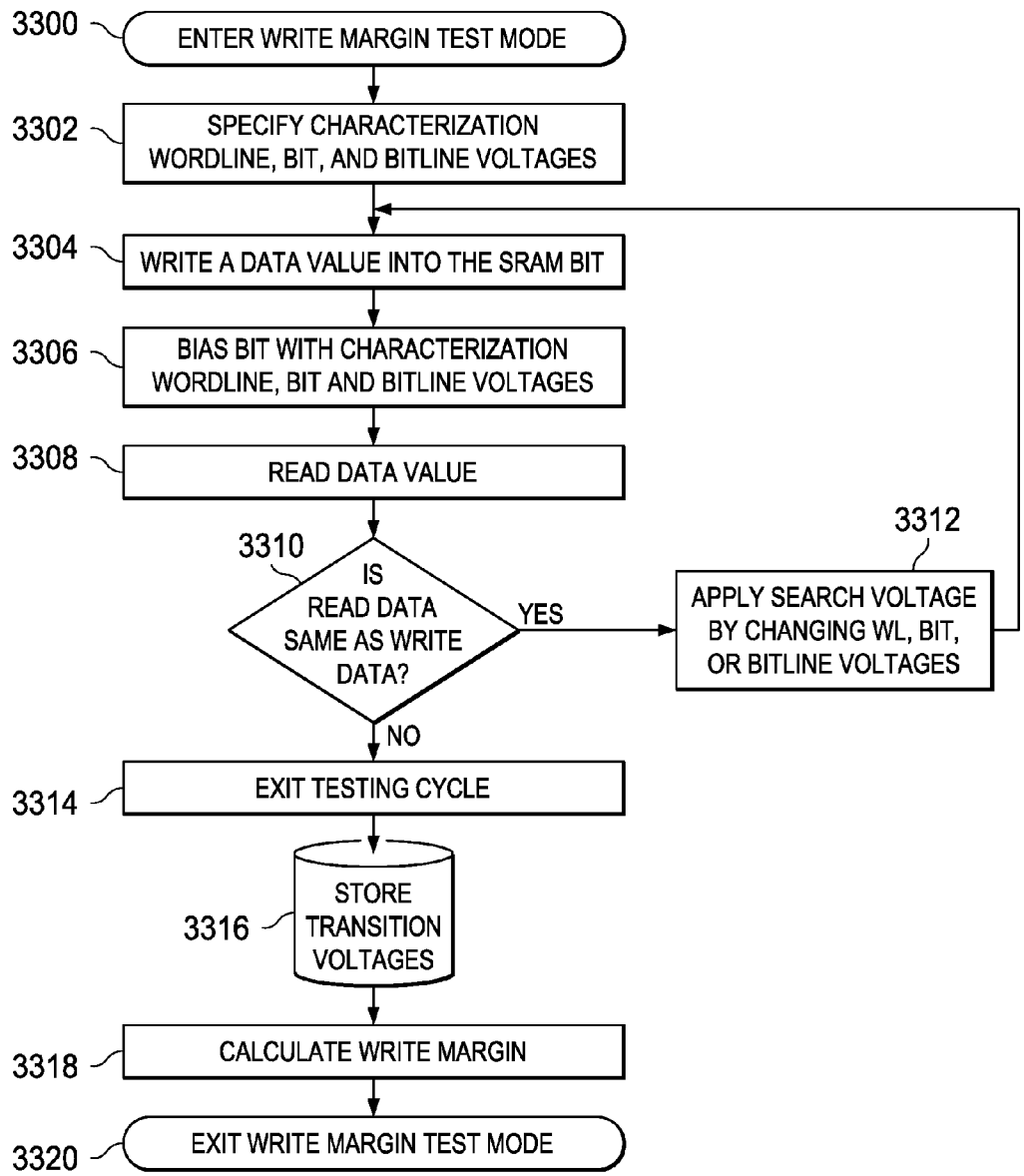
Figure 3D:
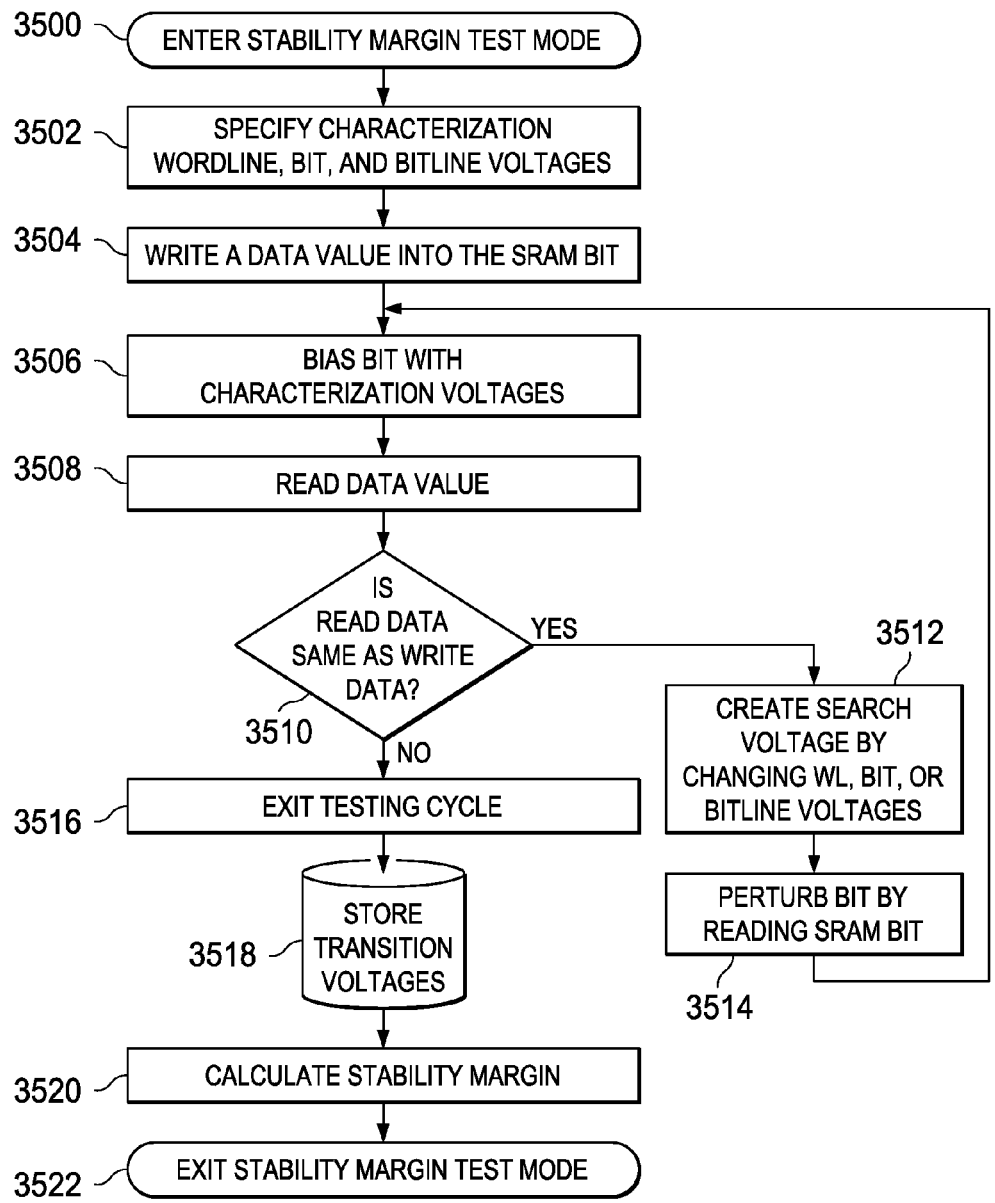

FIG. 3A is a flow chart describing a margin test. FIG. 3B through FIG. 3D are flowcharts describing the read margin test operation, the write margin test operation, and the bit stability test operation in more detail.

FIG. 3A is a flow chart describing a margin test. The test begins with step (3002) which is to send a signal to the SRAM circuit to switch it into a margin test mode. Next data is written into the SRAM bit (3006) using operational circuitry with the bit biased with the characterization voltages that are specified in step (3004). The characterization voltages could be the nominal operating voltages, could be the voltages at the upper or lower limit of the manufacturer's specified operating range, or some other voltages. In step (3008), using operational circuitry, the bit is biased with a series of search voltages to find the transition voltages. The search voltages may be applied in a series of liner voltage steps where each time the voltages are changed by 10 mV for example or some other search voltage algorithm may be used. The resolution of the transition voltage may be determined by the step size of the search voltages. After the transition voltages are found (3008) the margin is calculated (3010) as some mathematical function of the characterization voltages (3004) and the transition voltages (3008). For example the margin may be the difference between the wordline characterization voltage and the wordline transition voltage, the difference between the bit characterization voltage and the bit transition voltage, and the difference between the bitline and bitline bar characterization voltages and the bitline and bitline bar transition voltages.

Referring to FIG. 3B, the read margin test begins with step (3100) which is to send a signal to the SRAM circuit to switch it into the read margin test mode. Next step (3102) is to specify the characterization voltages for the SRAM bit margin test. The characterization voltages could be the nominal operating voltages, could be the voltages at the upper or lower limit of the manufacturer's specified operating range, or some other voltages. The characterization voltages for the write portion of the read margin test are chosen so a data value successfully writes into the SRAM bit. The characterization voltages for the read portion of the read margin test may be voltages where the SRAM bit successfully reads or may be voltages where the SRAM bit fails to read successfully. FIG. 3B describes a test sequence where the characterization voltages for the read portion of the read margin test have been chosen so that the SRAM bit reads successfully. In this case the search voltages are changed until the SRAM bit fails to read successfully at the read transition voltage as described below. If the characterization voltages had been chosen where the SRAM bit did not read successfully, then the search voltages would be changed until the SRAM bit would perform a successful read.

Data is then written into the SRAM bit in step (3104). The data in the SRAM bit is then read in step (3106) and the read data is checked (3108) to see if is equal to the written data (3104). If the read data (3106) is equal to the written data (3104), search voltages created (3112) by changing the wordline voltage, the bit voltage, the bitline voltage, or some combination of the three is applied to the SRAM bit and another read operation (3106) is performed. Steps (3112), (3106), and (3108) are repeated until the transition voltages are located. The transition voltages are the search voltages at the boundary between voltages where the SRAM bit operates properly and where it fails to operate properly. When a failure is detected the transition voltages are recorded (3110) and the bit is read again (3116) biased with the characterization voltages (3114) and checked again (3118) to see if the read data (3116) is the same as the written data (3104). If the data is the same then a read failure occurred in step (3108). The read margin is then calculated (3120) as the difference between characterization voltages (3102) and the corresponding stored transition voltages (3110). If, however, the read data (3116) is not the same as the write data (3104) when checked in step (3118), a stability failure has occurred and the stability margin is calculated (3122). The read margin test ends with step (3124).

Referring to FIG. 3C, the write margin test begins with step (3300) which is to send a signal to the SRAM circuit to switch the circuit into the write margin test mode. Next step (3302) is to specify the characterization voltages for the SRAM bit margin test. During a write margin test the read characterization voltages are chosen so the bit reads successfully. The write characterization voltages may be chosen so the bit writes successfully or may be chosen so the bit fails to write successfully. FIG. 3C describes a test where the write characterization voltages have been chosen so the SRAM bit writes successfully as described below. In this case search voltages are applied until the SRAM bit fails to write successfully. If the write characterization voltage had been chosen so that the SRAM bit failed to write successfully, then the search voltages would have been applied until the SRAM bit would write successfully.

Data is then written into the SRAM bit in step (3304). The SRAM bit is biased with the characterization voltages in step (3306) and the SRAM bit is read in step (3308.) The read data (3308) is checked (3310) to see if it is equal to the written data (3304). If the data is different, a write failure has been detected and testing is stopped (3314). If, however, the read data (3308) is equal to the written data (3304) then a set of search voltages created by changing the wordline voltage, the bit voltage, the bitline voltage or some combination of all three is applied and the data is rewritten into the SRAM bit (3304). Steps (3304), (3306), (3308), (3310) and (3312) are repeated again and again until the transition voltages are located. The transition voltages are the search voltages at the boundary between voltages where the SRAM bit operates properly and fails to operate properly. When a failure is detected, the testing is stopped (3314) and the transition voltages are recorded (3316). The write margin is then calculated (3318) as the difference between characterization voltages (3306) and the stored transition voltages (3316). The write margin test ends with step (3320).

Referring to FIG. 3D, the stability margin test begins with step (3500) which is to send a signal to the SRAM circuit to enter the stability margin test mode. The next step (3502) is to specify the characterization voltages for the SRAM bit margin test. The characterization voltages could be the nominal operating voltages, could be the voltages at the upper or lower limit of the manufacturer's specified operating range, or some other voltages where the SRAM bit successfully performs a write and read. Data is then written into the SRAM bit in step (3504). The SRAM bit is biased with the characterization voltages, in step (3506) and then the SRAM bit is read in step (3508). The read data (3508) is checked (3510) to see if it is equal to the written data (3504). If the data is different, then a failure has been detected and testing is stopped (3516). If, however, the read data (3508) is equal to the written data (3504) then a set of search voltages created (3512) by changing the wordline voltage, the bit voltage, the bitline voltage, or some combination of the three and the data in the SRAM bit is perturbed by performing a read disturb operation (3514). The data that is read during the read disturb operation is ignored. For example, as the bit voltage is lowered, the voltage difference between SNT and SNB is reduced. At some lowered bit voltage, the SNT/SNB voltage difference will become insufficient to retain the logic state during a read disturb operation causing the logic state to change. Next the bit is biased with the characterization voltages (3506) and the SRAM bit is read again (3508) to see if the logic state is the same or has been changed. Steps (3506), (3508), (3510), (3512) and (3514) are repeated again and again each time with changed search voltages until the transition voltages are located. The transition voltages are the search voltage at the boundary between voltages where the SRAM bit operates properly and fails to operate properly. When a failure is detected, the testing is stopped (3516) and the transition voltages are recorded (3518). The stability margin is then calculated (3520) as the difference between characterization voltages (3506) and the stored transition voltages (3518). The stability margin test ends with step (3522).

The read margin, write margin, and stability margin tests may be performed on each bit in an SRAM array. The test can be performed one bit at a time or the margin test may be performed on all bits in the array in parallel. For example, to measure all bits in the array in parallel, all bits in the array would be checked for write/read failures between each testing cycle in which the search voltage is changed. It is common practice to first write a pattern such as a checkerboard pattern into the array, test the margin of each bit in the array, then write the inverse of the pattern into the array and again test the margin of each bit in the array. This measures the margin of the SRAM bit with an initial logic state zero and also with an initial logic state one. It is understood that other patterns and inverse patterns may be used. While the preferred method is to raise or lower the wordline or bit voltage by approximately 10 millivolts during each testing cycle, smaller steps may be used for finer resolution at the cost of increased test time. Larger steps may also be used to reduce test time, or some combination of larger and shorter steps may be used to achieve the desired testing time vs margin voltage resolution tradeoff.

The margin tests described above include the influence of the SRAM array architecture and circuit design. At times, especially for troubleshooting purposes it is desirable to measure the SRAM bit read, write, and stability margins decoupled from the influence of the SRAM array architecture or circuit design. This can be accomplished by adding additional test circuitry to control the wordline pulse width, to extend the delay between wordline enable and sense amp enable, to extend the bitline precharge time, and to drive the bitlines during the margin testing.

Figure 4A:
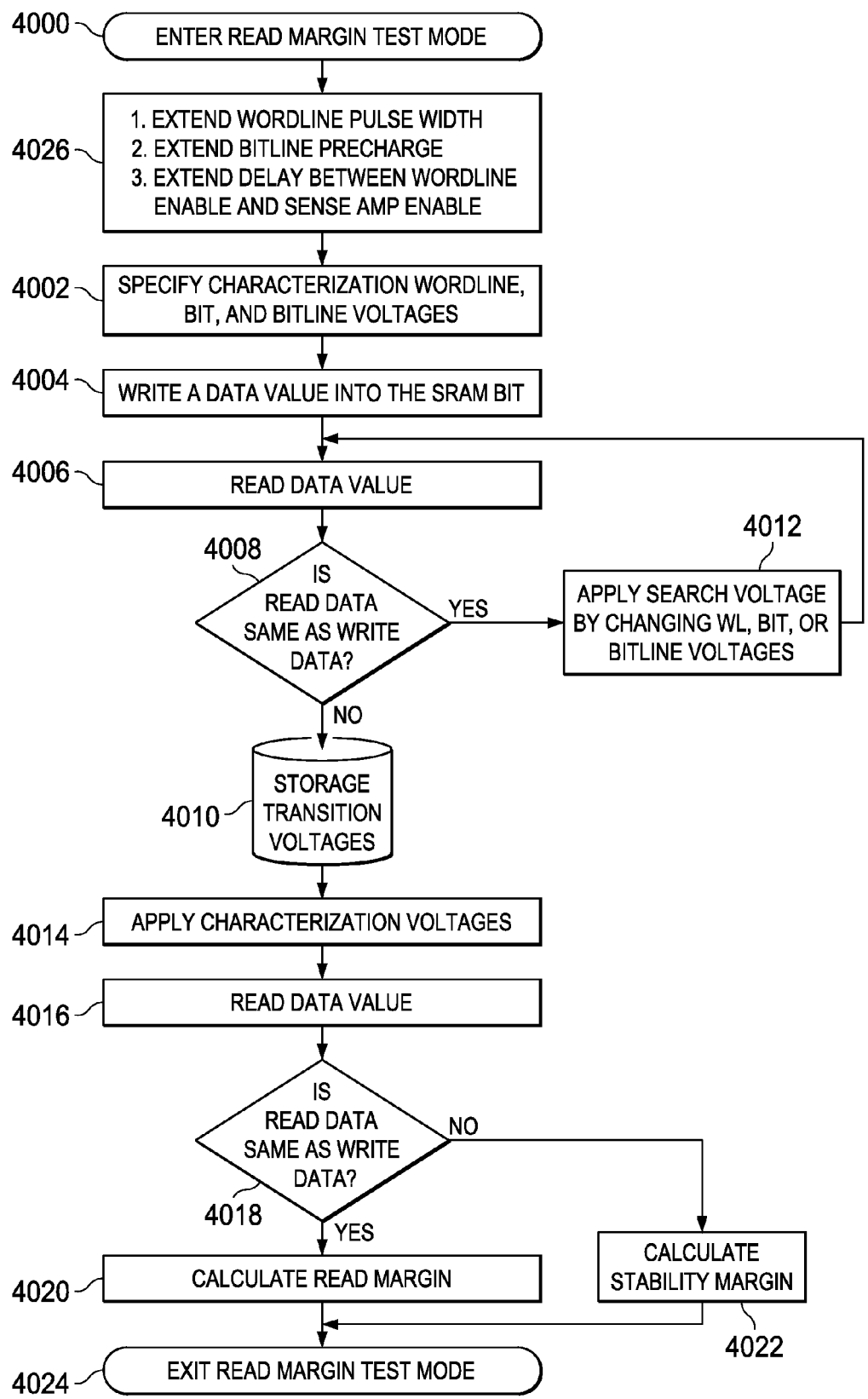
FIGS. 4A through 4C are flow charts of the Read Margin Test, the Write Margin Test, and the Stability Margin Test where each margin test is substantially free of layout and circuit design effects.

The testing method for read margin of the SRAM bit with the layout and read circuit influence substantially removed is shown in FIG. 4A. The test procedure is the same as described in FIG. 3B, except additional circuitry has been added to extend the wordline pulse width and to extend the delay between the wordline pulse enable and the sense amp enable (4026). During the testing cycle bitline precharge is extended and also the word line pulse width is extended for a time that is sufficient to allow the voltages on SNT and SNB and on BLT and BLB to stabilize. The delay between word line enable and sense amp enable also is extended sufficiently long to allow the voltages BLT and BLB to stabilize before the sense amp is enabled. Therefore, the read margin that is measured using the additional circuitry is largely independent of the SRAM array layout and read circuit design.

Figure 4B:
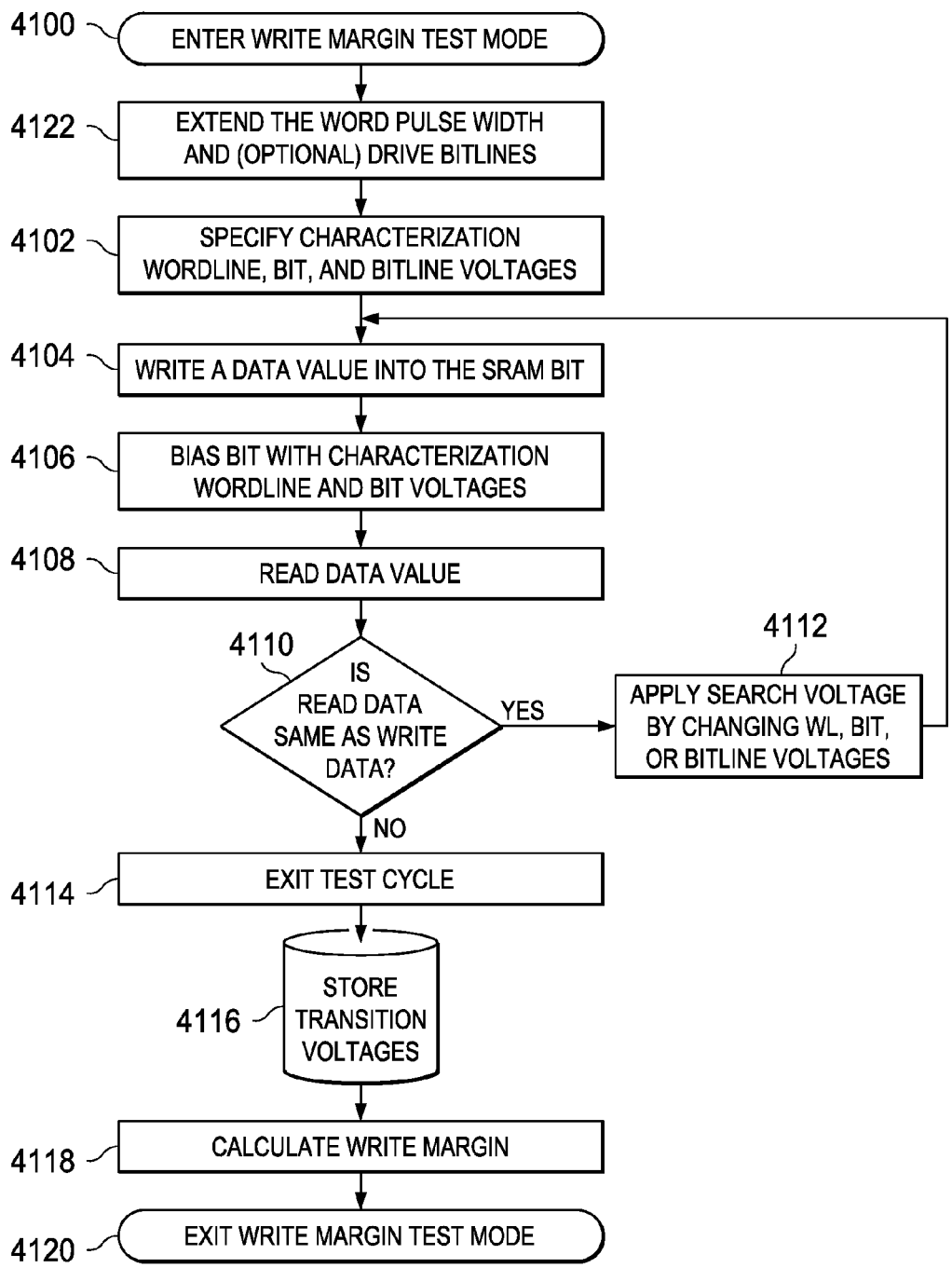

The testing method for write margin of the SRAM bit with the layout and write circuit effects substantially removed is shown in FIG. 4B. The test procedure is the same as described in FIG. 3C, except for additional circuitry that has been added to extend the wordline pulse width (4122) sufficiently so that the voltages on SNT and SNB are independent of the wordline pulse width. Another change that may be desirable is to drive the bitlines by connecting one bitline to Vdda and the other bitline to Vssa during the write operation to remove write margin sensitivity to bitline length. The write margin that is determined using the additional circuitry is largely independent of the SRAM array layout and the write circuitry.

Figure 4C:
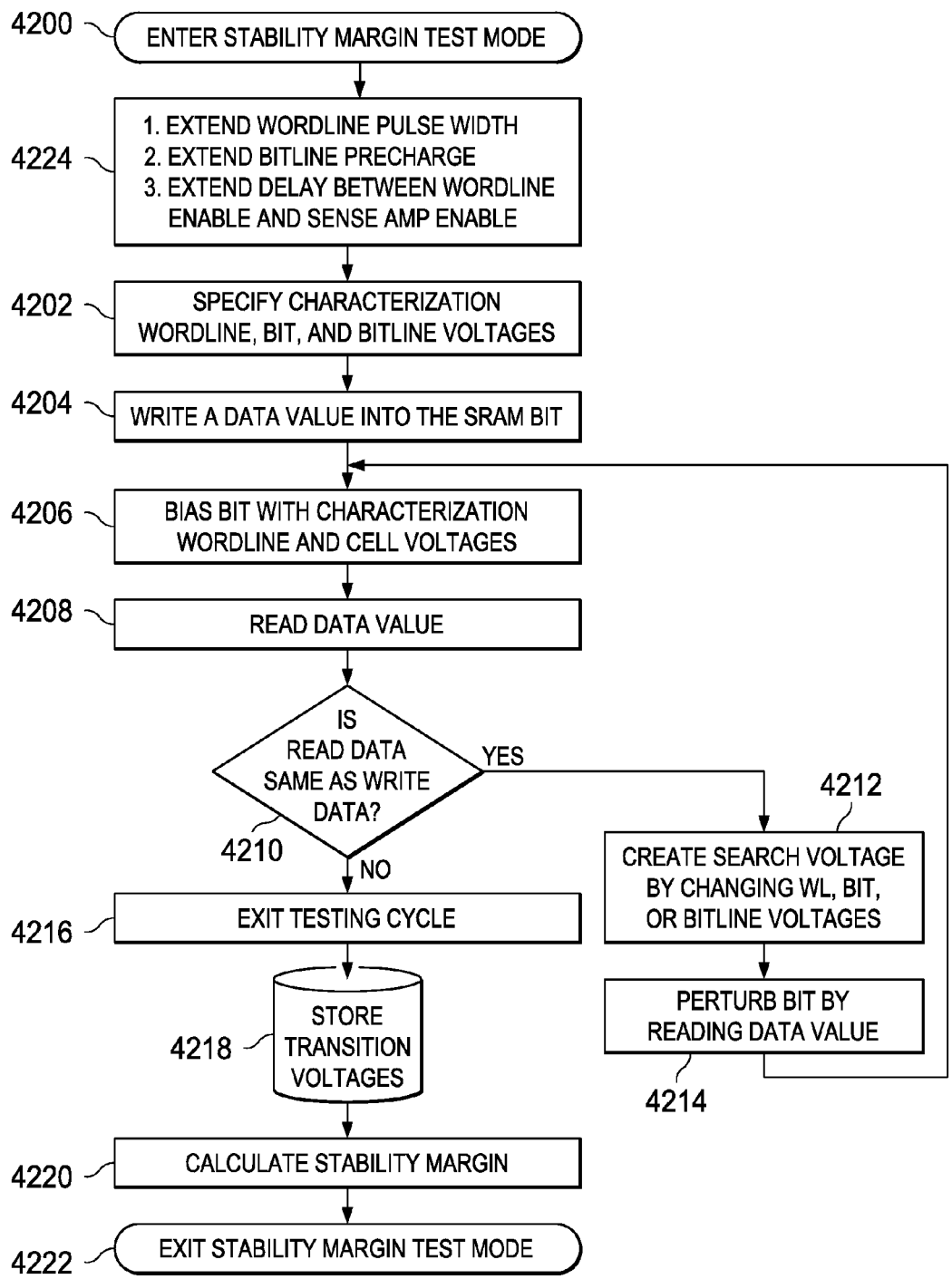

The testing method for stability of the SRAM bit with the layout and read/write circuit effects substantially removed is shown in FIG. 4C. The test procedure is the same as described in FIG. 3D, except additional circuitry has been added to extend the wordline pulse, extend bitline precharge time, and to extend the delay between the wordline enable and the sense amp enable (4224). The bitline precharge time is extended sufficiently to allow the bitline voltage to stabilize to a value that is not dependent upon bitline length. The wordline pulse width is also extended sufficiently to allow the voltage on the SRAM storage nodes to be independent of the wordline pulse width. The delay between the wordline enable and the sense amp enable allows the voltages BLT and BLB to stabilize to a value that is independent of bitline length prior to read. The bit stability that is determined using this additional circuitry is largely independent of the SRAM array layout and the read and write circuitry.

Figure 5:
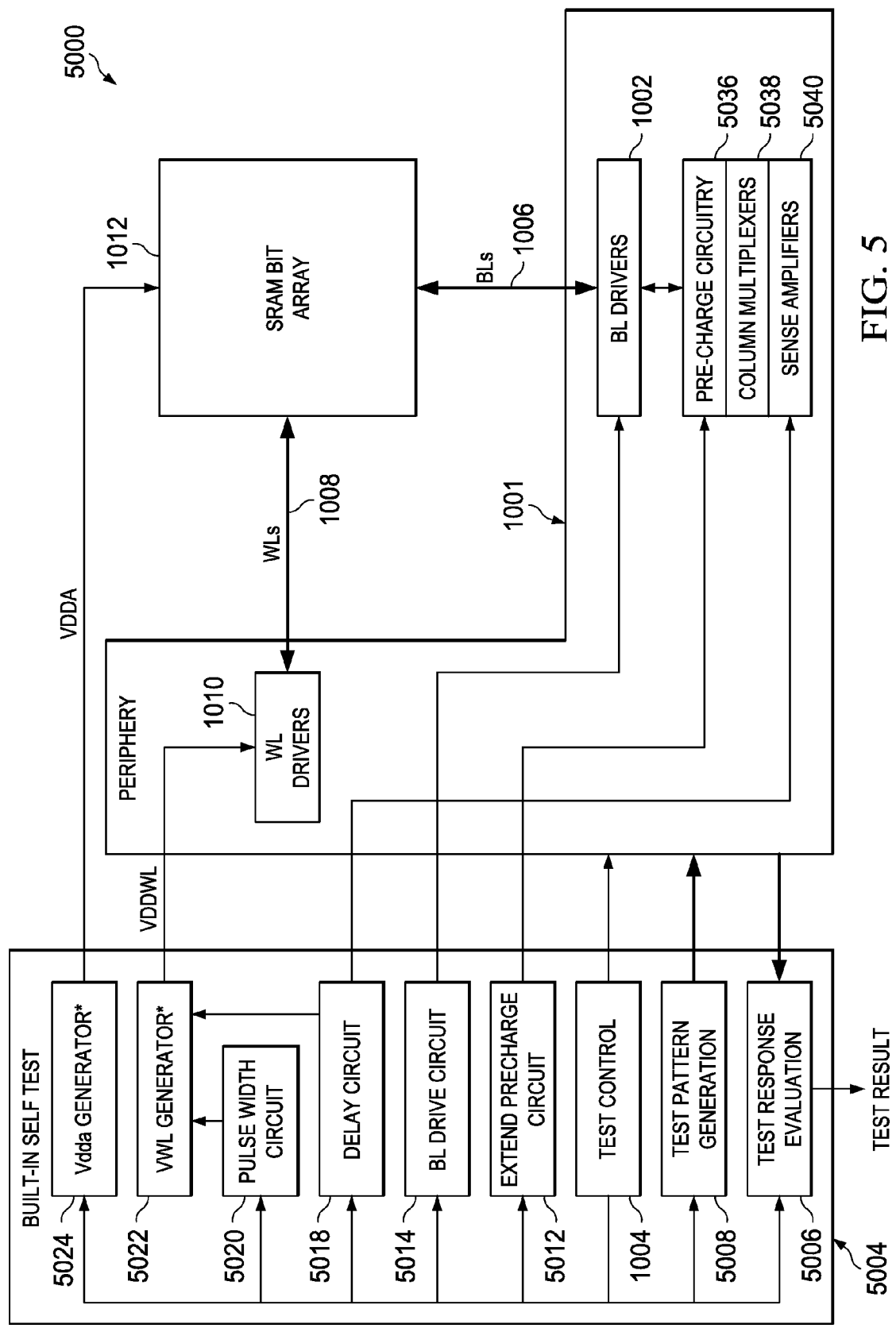
FIG. 5 is a diagram of the SRAM portion of an integrated circuit including circuitry according to the instant invention.

An integrated circuit (5000) containing an SRAM bit array (1012), a built-in self test circuit block (5004), and a periphery circuit block (1001) is illustrated in FIG. 5. The built-in self test circuit block (5004) includes a bit cell voltage (Vdda) generator circuit (5024), a wordline voltage (VWL) generator circuit (5022), and a BL Drive circuit (5014) for independent control of Vdda, VWL, and bitline voltage respectively during margin testing. With independent control of Vdda, VWL, and the bitline voltage during a margin test, the type of margin that fails may be determined. Also included in the built-in self test circuit block are a test control circuit (1004) which sends signals to the periphery circuits (1001) and to the other circuits within the built-in self test circuit (5004) during a test mode, a test pattern generation circuit (5008) which specifies the data value to be written into each SRAM bit during the write operations during test, and a test response evaluation circuit (5006) which determines if the read data value is the same as the written data value (if a fault has occurred) and then calculates the read, write, or stability margin depending upon which margin test is being performed. The other circuits shown in the built-in self test circuit block may or may not be included depending upon whether the circuitry is to have the capability to measure the margin of an SRAM bit with the effects of the SRAM array architecture and circuit design removed. The circuits which enable this capability include a pulse width circuit (5020) which may be used to extend the word line pulse width during a read or write operation, a delay circuit (5018) which may be used to adjust the delay between a wordline pulse and a sense amp enable pulse, a extend precharge circuit (5012) which may be used to adjust the length of the pre-charge enable pulse during a read, and a bit line drive circuit (5014) which may be used to drive the bitlines of the SRAM bit during a write. This is not an inclusive list of circuitry that is in a built-in self test circuit but rather a partial list to help illustrate the instant invention.

Included in the periphery control circuit (1001) of FIG. 5 are the wordline drivers (1010) which send wordline select signals to the SRAM bits in the SRAM bit array (1012) through wordlines (1008) and the bitline drivers (1002) which are connected to the SRAM bits in the SRAM bit array (1012) through bitlines (1006). Also included in the periphery control circuit block (1001) and coupled to the bitline drivers (1002) is other circuitry such as pre-charge circuitry (5036) for precharging the bitlines (1006) in an SRAM bit prior to a read or a write, a column multiplexer circuit (5038) for selecting the bitlines (1006) to the targeted SRAM bit, and sense amplifiers (5040) which are connected to the targeted SRAM bit during a read to sense a voltage differential between the SRAM bitlines (1006). This is not an inclusive list of circuitry that is in the periphery control circuitry but rather a partial list of circuitry to help illustrate the instant invention.

Unlike previous built-in self test circuitry the instant invention includes circuits (5024) and (5022) to individually control the bit voltage using Vdda and the wordline voltage using VWL during margin testing to enable the determination of which margin failure (read, write, or stability) has occurred. In addition, unlike previous test control circuitry which applies the same bit, wordline, and bitline voltage during every step of a margin test, the test control circuit (1004) applies different bit, wordline, and bitline voltages during certain steps of margin testing depending upon the specific type of margin test being performed. While voltage control circuits and the design of voltage control circuits are well known, including separate control of Vdda and VWL in the built-in self test circuitry is taught in this embodiment.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit comprising;
   a plurality of SRAM bits in an SRAM array in said integrated circuit;
   a periphery circuit containing wordline drivers, bitline drivers, and sense amplifiers; and
   a built-in self test circuit that during a margin test provides control of a wordline voltage, a bit voltage, and a bitline voltage that are separate from each other.

2. The circuit of claim 1 wherein said built-in self test circuitry includes a delay circuit to extend a time between a wordline pulse and a sense amp enable pulse.

3. The circuit of claim 1 wherein said built-in self test circuitry includes a pulse width circuit which adjusts a length of a wordline pulse.

4. The circuit of claim 1 wherein said built-in self test circuitry includes an extend precharge circuit which adjusts a time between a wordline pulse and a sense amp enable pulse.

5. The circuit of claim 1 wherein said built-in self test circuitry includes a bitline drive circuit which drives a voltage on bitlines during a write.

* * * * *